(12) United States Patent
Yu et al.

(10) Patent No.: US 10,424,980 B2
(45) Date of Patent: Sep. 24, 2019

(54) MOTOR AND STATOR THEREOF

(71) Applicant: JOHNSON ELECTRIC INTERNATIONAL AG, Murten (CH)

(72) Inventors: Hui Fang Yu, Shenzhen (CN); Moola Mallikarjuna Reddy, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 240 days.

(21) Appl. No.: 15/419,178

(22) Filed: Jan. 30, 2017

(65) Prior Publication Data

US 2017/0222497 A1 Aug. 3, 2017

(30) Foreign Application Priority Data

Feb. 3, 2016 (CN) .......................... 2016 1 0076636

(51) Int. Cl.
| | |
|---|---|
| *H02K 11/00* | (2016.01) |
| *H02K 1/14* | (2006.01) |
| *H02K 3/52* | (2006.01) |
| *H02K 1/18* | (2006.01) |
| *H02K 11/33* | (2016.01) |

(Continued)

(52) U.S. Cl.
CPC ............. *H02K 1/146* (2013.01); *H02K 1/187* (2013.01); *H02K 3/522* (2013.01); *H02K 11/33* (2016.01); *H02K 2203/03* (2013.01); *H05K 3/184* (2013.01); *H05K 3/3426* (2013.01); *H05K 2201/09027* (2013.01); *H05K 2201/09072* (2013.01); *H05K 2201/10287* (2013.01); *Y02P 80/30* (2015.11)

(58) Field of Classification Search
CPC .... H02K 2203/03; H02K 11/33; H02K 1/146; H02K 1/187; H02K 3/522; H05K 3/184; H05K 3/3426; H05K 2201/09027
USPC .......................................................... 310/71
See application file for complete search history.

(56) References Cited

U.S. PATENT DOCUMENTS 5,831,355 A * 11/1998 Oku ................... G11B 19/2009
                                                           310/12.31
7,105,963 B2 * 9/2006 Ito ........................... H02K 3/522
                                                           310/67 R (Continued)

FOREIGN PATENT DOCUMENTS

| CN | 201115231 Y | 9/2008 |
|---|---|---|
| JP | H08196068 A | 7/1996 |
| JP | 2000117664 A | 4/2000 |

OTHER PUBLICATIONS

Hanselman, Duane C. "Brushless permanent magnet motor design", Jan. 1, 2006, Magna Physics Publishing, Lebanon, Ohio, USA; p. 111-114.

(Continued)

*Primary Examiner* — Thanh Lam
(74) *Attorney, Agent, or Firm* — Muncy, Geissler, Olds & Lowe, P.C.

(57) ABSTRACT

A motor stator includes a stator core, a winding wound around the stator core, and a circuit board connected with the winding. The circuit board forms a through hole. The through hole has an opening formed at an outer edge of the circuit board. A wire terminal of the winding slides into the through hole via the opening, and a distal end of the wire terminal is bent and soldered to a surface of the circuit board after passing through the through hole.

19 Claims, 7 Drawing Sheets

(51) Int. Cl.
*H05K 3/18* (2006.01)
*H05K 3/34* (2006.01)

(56) References Cited

U.S. PATENT DOCUMENTS

| | | | |
|---|---|---|---|
| 8,552,602 B2* | 10/2013 | Takada | H02K 3/44 |
| | | | 310/43 |
| 2009/0285699 A1 | 11/2009 | Muraoka et al. | |
| 2012/0200957 A1 | 8/2012 | Yawata | |
| 2019/0052153 A1* | 2/2019 | Usami | H02K 11/33 |

OTHER PUBLICATIONS

Wang, Xiuhe, "Permanent Magnet Moror—version 2," China Electric Power Press, Oct. 2010, 2 pages.

\* cited by examiner

MOTOR AND STATOR THEREOF

CROSS REFERENCE TO RELATED APPLICATIONS

This non-provisional patent application claims priority under 35 U.S.C. § 119(a) from Patent Application No. 201610076636.3 filed in The People's Republic of China on 3 Feb. 2016.

FIELD OF THE INVENTION

This invention relates to a motor, and in particular to a stator of the motor.

BACKGROUND OF THE INVENTION

Motors are commonly used driving devices, which includes a stator and a rotor rotatable relative to the stator. The stator includes a stator core, a winding wound around the stator core, and a circuit board connected with the winding. The circuit board is provided with a driving circuit and electronic components such as a Hall IC. An external power source supplies power to coils of the winding through the driving circuit of the circuit board to stimulate the stator forming alternating magnetic fields. The alternating magnetic fields interact with magnetic poles of the rotor to push the rotor to continuously rotate, which in turn drives a load.

In a typical stator, to connect the winding to the circuit board, a through hole is usually formed in the circuit board, a wire terminal of the winding is inserted into the through hole, and solder is filled into the through hole to solder the wire terminal in the through hole, making the wire terminal mechanically and electrically connect with the driving circuit. However, in the above connection manner, the solder joint can easily fall off due to stress of enameled wires (such as winding force and thermal deformation force) and external factors such as mechanical vibrations, which may cause short circuit or sparks and hence affect lifespan and reliability of the motor.

SUMMARY OF THE INVENTION

Accordingly, there is disclosed a motor stator in which the connection between the winding and the circuit board is more stable and the connecting operation is facilitated.

In one aspect, a stator of a motor is provided which includes a stator core, a winding wound around the stator core, and a circuit board connected with the winding. The circuit board forms a through hole. The through hole has an opening formed at an outer edge of the circuit board. A wire terminal of the winding slides into the through hole via the opening, and a distal end of the wire terminal is bent and soldered to a surface of the circuit board after passing through the through hole.

Preferably, the opening is tapered which gradually expands.

Preferably, a protective element is snap-fit in the through hole to isolate the wire terminal of the winding from a wall surface of the through hole.

Preferably, a portion of the protective element in contact with the wire terminal of the winding has a smooth curved surface. More preferably, the curved surface is an arc surface.

Preferably, the protective element comprises a C-shaped main body and at least one claw extending from the main body, the main body covers on a surface of the circuit board, the claw engages an opposite surface of the circuit board to fix the protective element to the circuit board after passing through the through hole.

Preferably, the protective element is made of plastic.

Preferably, the circuit board is has a circular sector shape.

Preferably, the distal end of the winding is tin-soldered to the surface of the circuit board.

In another aspect, a motor is provided which includes the above-described stator and a rotor rotatable relative to the stator. Preferably, the motor is an outer rotor motor, and the rotor surrounds an outer periphery of the stator. More preferably, the motor is a single phase motor.

Preferably, an air gap is formed between the stator and the rotor, the stator core comprises a yoke and a plurality of teeth extending from the yoke, a distal end of each of the teeth is formed with a tooth tip, a slot opening is formed between adjacent tooth tips, and a width of the slot opening is not greater than three times of a width of the air gap.

DETAILED DESCRIPTION OF THE PREFERRED EMBODIMENTS

Figure 1:
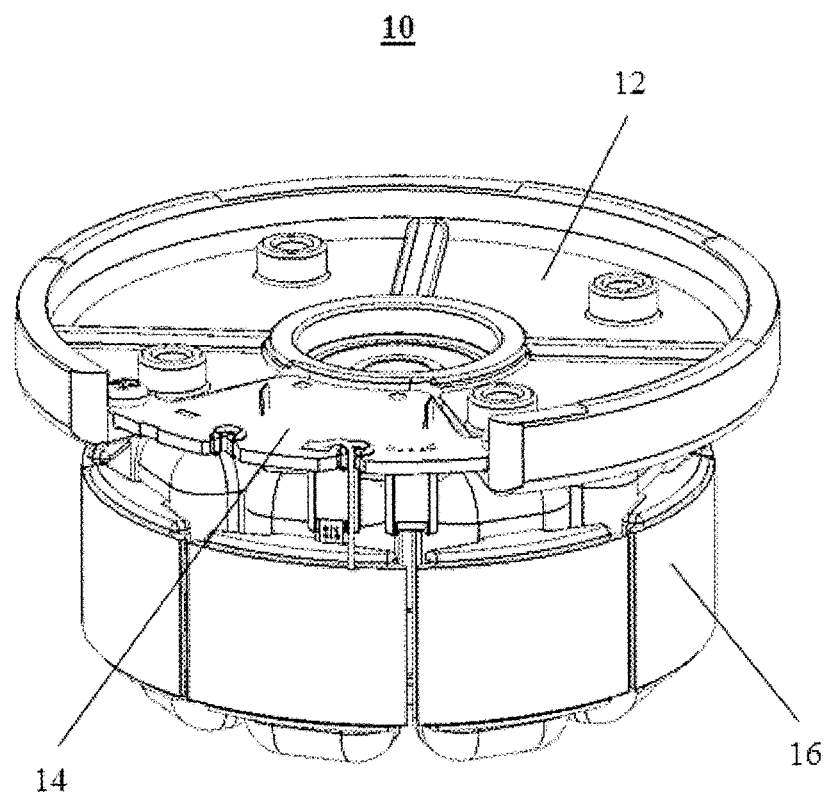
FIG. 1 illustrates a stator of a motor according to one embodiment of the present invention.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

FIG. 1 illustrates a motor stator 10 according to one embodiment of the present invention, which includes a support base 12, a circuit board 14 fixed on the support base 12, and an armature 16 mounted around the support base 16.

Figure 2:
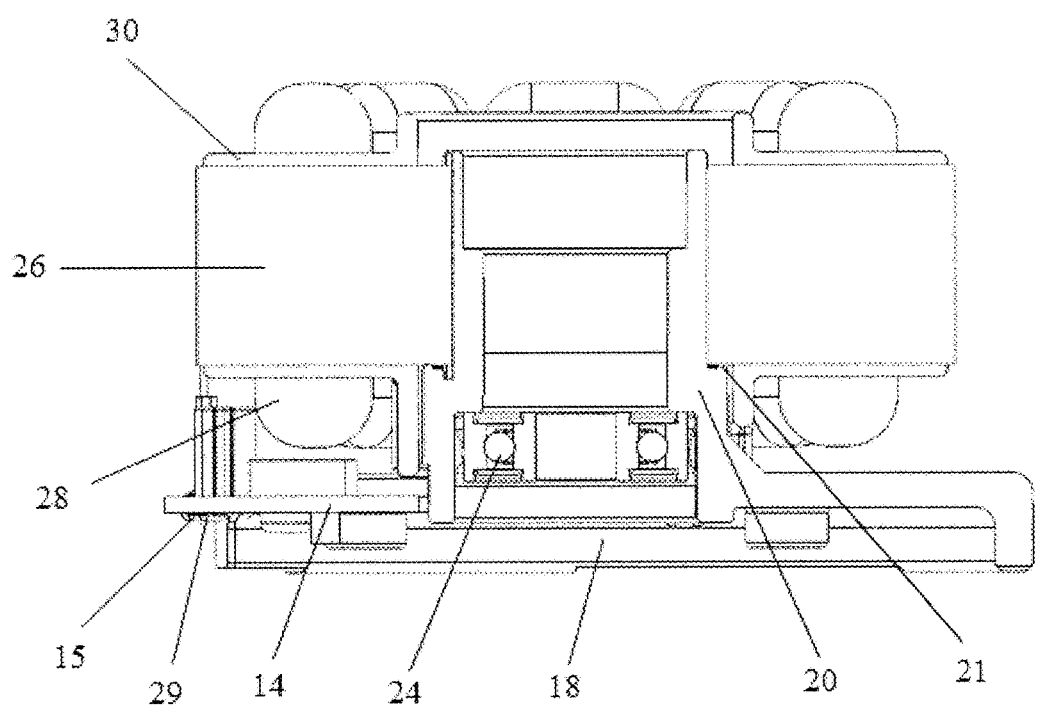
FIG. 2 is a sectional view of the stator of FIG. 1.
Figure 3:
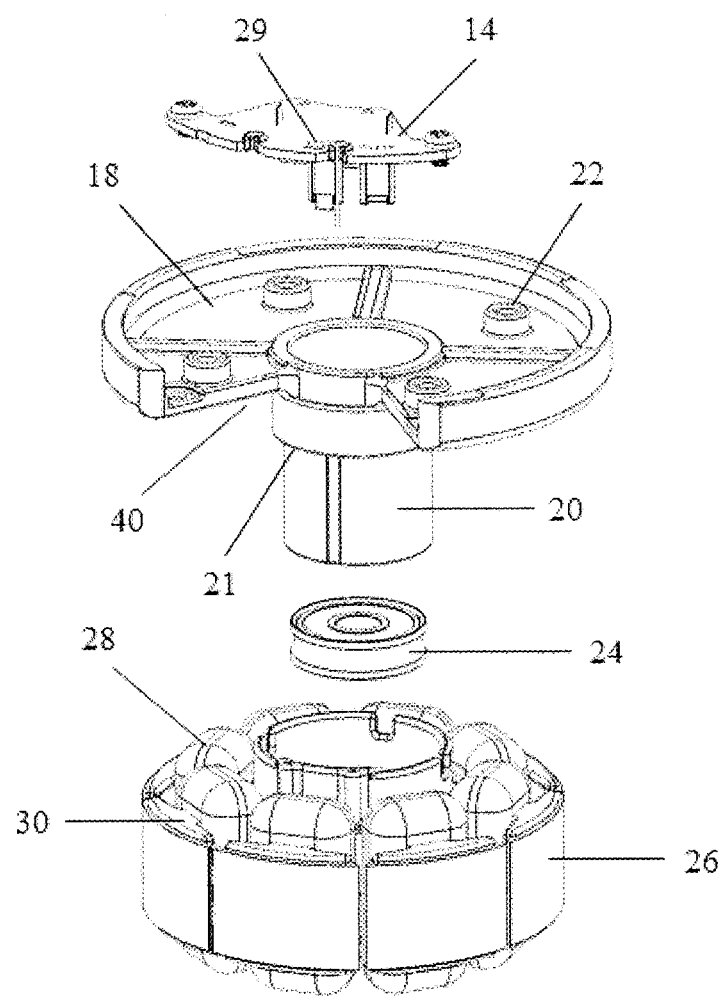
FIG. 3 is an exploded view of the stator of FIG. 1.

Referring to FIG. 2 and FIG. 3, the support base 12 includes a bottom base 18 and a protruding post 20 extending integrally from a middle of the bottom base 18. The bottom base 18 is generally a flat circular disc having a large radial size. A plurality of fixing posts 22 is formed on the bottom base 18 adjacent an outer edge thereof, and fasteners such as screws can pass through the fixing posts 22 to fixedly connect the motor to another structure. The protruding post 20 is hollow and cylindrical, with a bearing assembly 24 disposed therein for supporting a rotor for rotation. Preferably, the bearing assembly includes a bearing and a bearing sleeve. The bearing is preferably a ball bearing. A rotary shaft of the rotor is rotatably inserted into the bearing assembly 24.

The armature 16 is attached around the protruding post 20. An interference fit may be formed between the armature 16 and the protruding post 20. The armature 16 includes a stator core 26, a winding 28 wound around the stator core 26, and an insulating bracket 30 mounted on the stator core 26 to isolate the stator core 26 from the winding 28.

Figure 4:
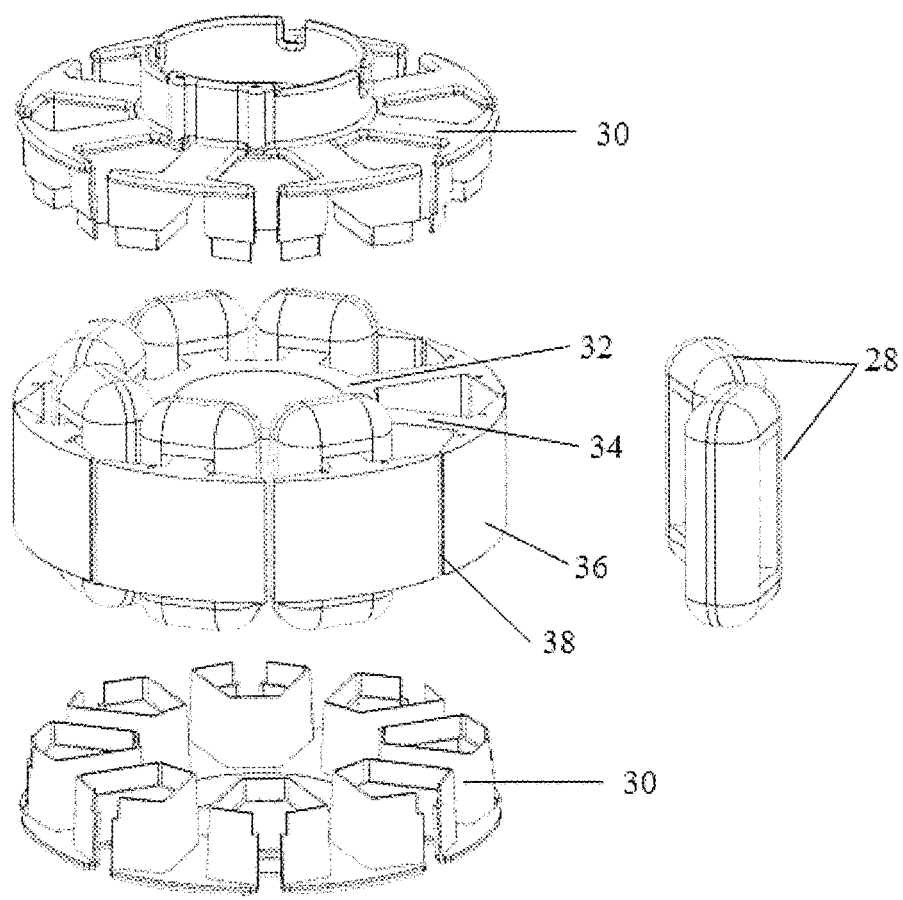
FIG. 4 is an exploded view of the armature of the stator of FIG. 3.

Referring also to FIG. 4, the stator core 26 is formed by stacking magnetic laminations such as silicon steel sheets. The stator core 26 includes an annular yoke 32 and a plurality of teeth 34 extending radially outwardly from an outer periphery of the yoke 32. The yoke 32 is attached around the protruding post 20 to fix the armature 16. Preferably, an outer surface of the protruding post 20 is formed with a step 21 which abuts against the yoke 32 of the stator core 26 to axially position the yoke 32 (FIG. 2). The teeth 34 are evenly spaced along a circumferential direction of the yoke 32, and a radial distal end of each tooth 34 is formed with an arcuate tooth tip 36. The tooth tip 36 has a circumferential length larger than a radial width. Circumferential ends of the tooth tip 36 extend out of the insulating bracket 30, and the circumferential ends of adjacent tooth tips 36 form therebetween a narrow slot opening 38 for reducing cogging torque.

The winding 28 is wound around the teeth 34 of the stator core 26 and located radially inside the tooth tips 36. The winding 28 is formed by winding an enameled wire. A wire terminal 29 of the winding 28 is connected with the circuit board 14 (FIG. 2 and FIG. 3). Preferably, the circuit board 14 has a corresponding driving circuit to supply a single phase alternating direct current to the winding 28. In this embodiment, the circuit board 14 has a circular sector shape which has a reduced size in comparison with a conventional annular circuit board. This can also provide efficient utilization of board materials and reduce the generation of waste materials during fabrication. In this embodiment, the bottom base 18 has a cutout 40 (FIG. 3) matching with the circuit board 14 in shape and size. In assembly, the circuit board 14 is received in the cutout 40 of the bottom base 18 and is fixedly connected to the bottom base 18 with fasteners such as screws. In this manner, the circuit board 14 does not occupy additional space, which effectively reduces an axial size of the stator 10 and hence an axial size of a motor having the stator 10.

Figure 5:
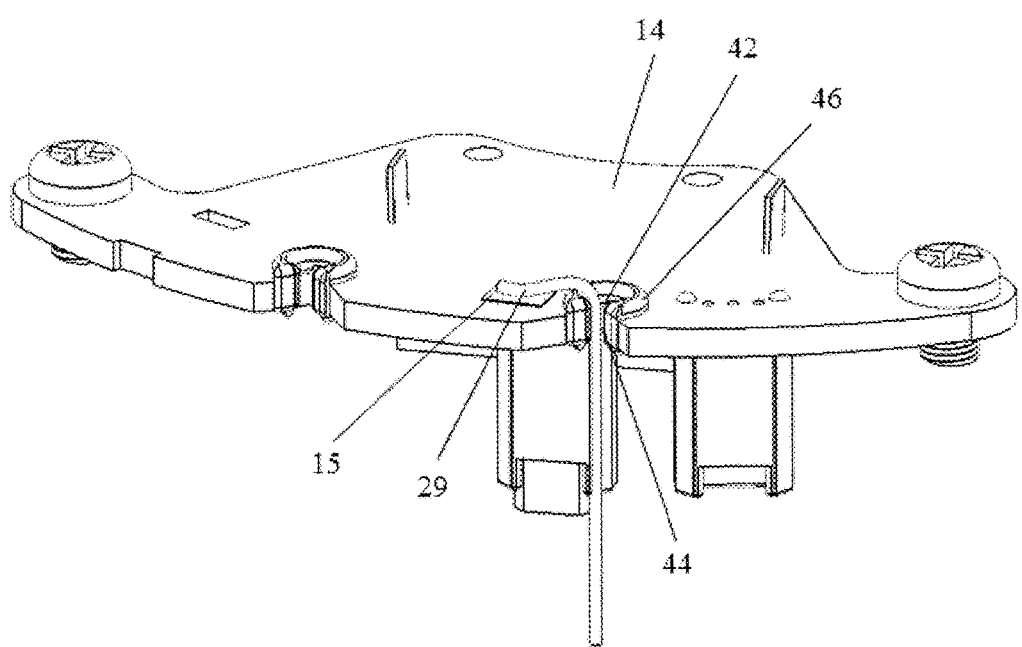
FIG. 5 illustrates the connection between the circuit board and the winding of the stator.

Referring also to FIG. 5, corresponding to the wire terminal 29 of the winding 28, the circuit board 14 forms a through hole 42 at its outer edge. The through hole 42 has a C-shaped cross-section, which extends through the circuit board 14 along an axial direction and has a radial opening 44 at the outer edge of the circuit board 14. As such, there is no need for the wire terminal 29 of the winding 28 to insert through the through hole 42 along the axial direction, but instead can transversely slide into the through hole 42 via the opening 44, which facilitates the mechanical connection between the winding 28 and the through hole 42 of the circuit board 14 and is time saving. Preferably, the opening 44 is tapered which gradually expands in a direction toward the outer edge of the circuit board 14, thus further facilitating the wire terminal 29 sliding into the through hole 42. After the wire terminal 29 of the winding 28 slides into the through hole 42, a portion of the wire terminal extending out of the through hole 42 is bent and soldered to a surface of the circuit board 14 by using solder 15. Preferably, the solder is tin. Because the wire terminal 29 of the winding 28 is bent and pulled to connect to the surface of the circuit board 14 after passing through the through hole 42, the bending portion of the wire terminal 29 is supported on an edge of the opening 44 of the circuit board 14, which can bear an external force to protect the solder joint, thus ensuring stability and safety of the electrical connection between the winding 28 and the circuit board 14.

Figure 6:
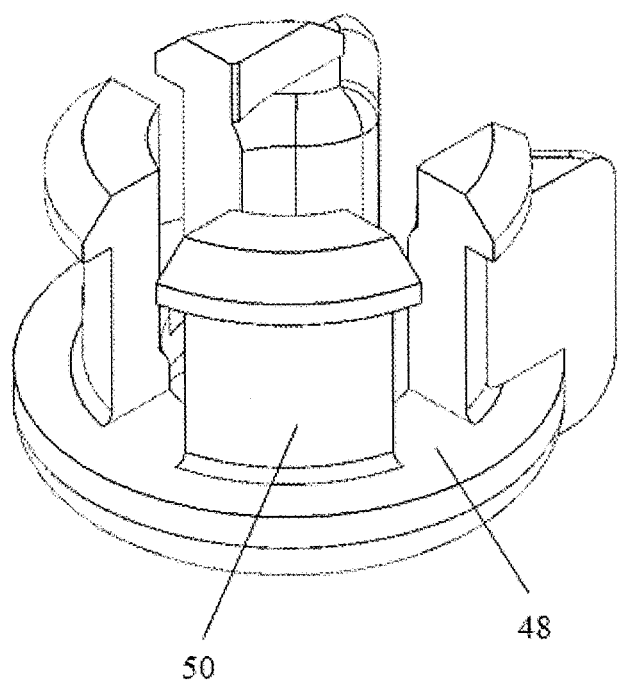
FIG. 6 illustrates a protective element.

In addition, in order to avoid direct contact between the wire terminal 29 and a sharp edge of the circuit board 14 at the through hole 42, a protective element 46 is snap-fit in the through hole 42. As shown in FIG. 6, the protective element 46 includes a main body 48 and at least o claw 50 extending from the main body 48. In this embodiment, the protective element 46 has four claws 50. The main body 48 cover on a surface of the circuit board 14 (an upper surface as illustrated in the figure). The claws pass through the through hole 42, and engages with an opposite surface of the circuit board 14 (a lower surface as illustrated in the figure), and thus covers the circuit board edge at the through hole 42. Preferable, the main body 48 is C-shaped or U-shaped with an opening. Two of the claws 50 located at the opening respectively covers lateral surface of the circuit board 14 at the opening 44. The protective element 46 is made of insulating material with a certain degree of elasticity such as plastic. In assembly with the circuit board 14, the protective element 46 may be deformed to shrink in a radial size thereof, thus facilitating its claws 50 passing through the through hole 42. Once the claws 50 have passed through the through hole 42, the claws 50 is released and engages with the circuit board 14 to fix the protective element 46. The wire terminal 29 of the winding 28 slides into the through hole 42 via the opening 44, and the winding 28 is insulated from a wall surface of the through hole 42 of the circuit board 14 by means of the protective element 46, thus ensuring electrical safety. Preferably, a portion of the protective element 46 in contact with the wire terminal 29 has a smooth curved surface, such as an arc surface, to avoid break of the wire terminal 29 under stress. The protective element can therefore better protect the wire terminal 29, such that the wire terminal 29 is capable of bearing a greater external stress.

Figure 7:
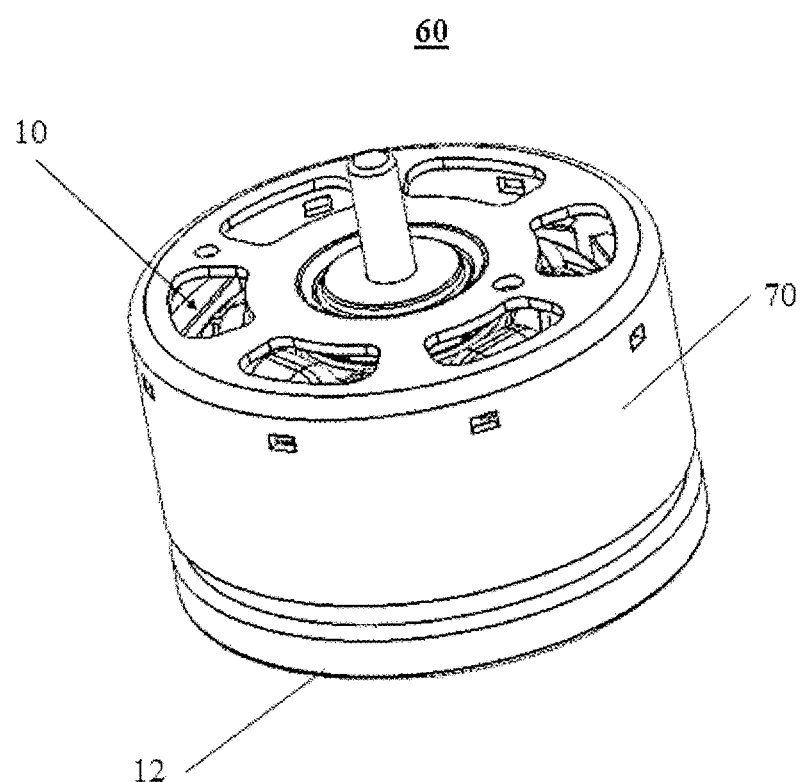
FIG. 7 illustrates a motor having the stator of FIG. 1.

FIG. 7 illustrates a motor 60 according to one embodiment of the present invention. The motor 60 includes a stator 10 illustrated in FIG. 1 and a rotor 70. Preferably, the motor 60 is a single phase outer rotor motor. The rotor 70 is mounted to the stator 10 and surrounds an outer periphery of the stator 10. An air gap is formed between the stator 10 and the rotor 70, and a width of the slot opening 38 between adjacent tooth tips 36 of the stator 10 is no greater than three times of a radial width of the air gap.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated herein should not be interpreted as limits to the present invention, and the scope of the invention is to be determined by reference to the claims that follow.

The invention claimed is:

1. A stator of a motor, comprising:
   a stator core,
   a winding wound around the stator core; and
   a circuit board connected with the winding, the circuit board forming a through hole, the through hole having an opening formed at an edge of the circuit board, a wire terminal of the winding sliding into the through hole via the opening, and a distal end of the wire terminal bent and soldered to a surface of the circuit board after passing through the through hole,
   wherein the circuit board has a circular sector shape.

2. The stator of claim 1, wherein the opening is tapered which gradually expands outwardly.

3. The stator of claim 1, wherein a protective element is snap-fit in the through hole to isolate the wire terminal of the winding from a wall surface of the through hole.

4. The stator of claim 3, wherein a portion of the protective element in contact with the wire terminal of the winding has a smooth curved surface.

5. The stator of claim 4, wherein the curved surface is an arc surface.

6. The stator of claim 3, wherein the protective element comprises a C-shaped main body and at least one claw extending from the main body, the main body covers on a surface of the circuit board, the claw engages an opposite surface of the circuit board to fix the protective element to the circuit board after passing through the through hole.

7. The stator of claim 3, wherein the protective element is made of plastic.

8. The stator of claim 1, wherein the distal end of the winding is tin-soldered to the surface of the circuit board.

9. A motor comprising a stator and a rotor rotatable relative to the stator, wherein the stator comprises:
a stator core,
a winding wound around the stator core; and
a circuit board connected with the winding, the circuit board forming a through hole, the through hole having an opening formed at an edge of the circuit board, a wire terminal of the winding sliding into the through hole via the opening, and a distal end of the wire terminal bent and soldered to a surface of the circuit board after passing through the through hole,
wherein an air gap is formed between the stator and the rotor, the stator core comprises a yoke and a plurality of teeth extending from the yoke, a distal end of each of the teeth is formed with a tooth tip, a slot opening is formed between adjacent tooth tips, and a width of the slot opening is not greater than three times of a width of the air gap.

10. The motor of claim 9, wherein the motor is an outer rotor motor, and the rotor surrounds an outer periphery of the stator.

11. The motor of claim 9, wherein the motor is a single phase motor.

12. The motor of claim 9, wherein the opening is tapered which gradually expands outwardly.

13. The motor of claim 9, wherein a protective element is snap-fit in the through hole to isolate the wire terminal of the winding from a wall surface of the through hole.

14. The motor of claim 13, wherein a portion of the protective element in contact with the wire terminal of the winding has a smooth curved surface.

15. The motor of claim 14, wherein the curved surface is an arc surface.

16. The motor of claim 13, wherein the protective element comprises a C-shaped main body and at least one claw extending from the main body, the main body covers on a surface of the circuit board, the claw engages an opposite surface of the circuit board to fix the protective element to the circuit board after passing through the through hole.

17. The motor of claim 13, wherein the protective element is made of plastic.

18. The motor of claim 9, wherein the circuit board has a circular sector shape.

19. A motor comprising a stator and a rotor rotatable relative to the stator, wherein the stator comprises:
a stator core,
a winding wound around the stator core; and
a circuit board connected with the winding, the circuit board forming a through hole, the through hole having an opening formed at an edge of the circuit board, a wire terminal of the winding sliding into the through hole via the opening, and a distal end of the wire terminal bent and soldered to a surface of the circuit board after passing through the through hole, wherein the circuit board has a circular sector shape.

* * * * *